United States Patent [19]

Ponziani et al.

[11] Patent Number: 4,797,110
[45] Date of Patent: Jan. 10, 1989

[54] PRINTED CIRCUIT BOARD WITH INTEGRAL ELECTRICAL CONNECTOR AND METHOD FOR MAKING IT USING WAVE SOLDERING

[75] Inventors: Richard L. Ponziani, Dayton; William E. Davies, Kettering; Everett P. Trittschuh, III, Centerville, all of Ohio

[73] Assignee: General Motors Corporation, Detroit, Mich.

[21] Appl. No.: 147,043

[22] Filed: Jan. 21, 1988

Related U.S. Application Data

[63] Continuation of Ser. No. 906,125, Sep. 8, 1986, abandoned.

[51] Int. Cl.⁴ .............................................. H01R 9/09
[52] U.S. Cl. ........................................ 439/83; 439/876; 228/180.1
[58] Field of Search ............... 228/180.1; 339/275 B, 339/17 C, 32, 33

[56] References Cited

U.S. PATENT DOCUMENTS

| | | | |
|---|---|---|---|
| 2,869,090 | 1/1959 | Johanson | 439/79 |
| 2,972,727 | 2/1961 | Flanagan, Jr. et al. | 439/82 |
| 3,208,027 | 9/1965 | Johnson | 439/80 |
| 3,222,632 | 12/1965 | Fuller | 439/844 |
| 3,428,934 | 2/1969 | Reider, Jr. et al. | 439/876 |
| 3,681,738 | 8/1972 | Friend | 439/79 |
| 3,747,045 | 7/1973 | Stross | 339/275 B |
| 3,784,955 | 1/1974 | Reynolds et al. | 439/79 |
| 3,877,769 | 4/1975 | Berg, deceased, et al. | 439/83 |
| 3,885,854 | 5/1975 | Reimer | 439/722 |
| 4,353,609 | 10/1982 | Haas | 339/17 C |

*Primary Examiner*—Fred A. Silverberg
*Assistant Examiner*—Richard K. Seidel
*Attorney, Agent, or Firm*—Robert M. Sigler

[57] ABSTRACT

A printed circuit board includes a pair of mounting openings for a connector member comprising a strip of electrically conducting material having a pair of oppositely oriented concave legs joined in a convex head. Each of the legs has an end abutting the circuit board and a narrower foot extending through one of the openings and soldered to the printed circuit on the opposite side of the board in a wave soldering process. The spacing of the mounting openings is less than that of the ends of the legs of the unbiased connector member so that the latter must be pinched closed to be mounted on the board and is positively retained thereon until soldered. The spacing also maintains the concave legs of the mounted connector member in contact with each other at their point of closest approach for controlled retention of a mating connecting member shaft but separated at the ends so that no molten solder wicks therebetween by capillary action in the wave soldering process. At least one of the convex head and the circuit board midway between the mounting openings is provided with an access opening for the mating connector member shaft, which opening contains no solder.

4 Claims, 1 Drawing Sheet

PRINTED CIRCUIT BOARD WITH INTEGRAL ELECTRICAL CONNECTOR AND METHOD FOR MAKING IT USING WAVE SOLDERING

This is a continuation of application Ser. No. 906,125, filed Sept. 8, 1986, now abandoned.

BACKGROUND OF THE INVENTION

This invention relates to a connector for a printed circuit board, and particularly to such a connector for a board which is wave soldered. In one method of manufacturing a circuit board, the insulating board with a printed circuit on one side has discrete circuit elements mounted on the opposite side with leads projecting through holes in the board to the printed circuit side. The board is then dipped in a pool of molten solder in a wave soldering process. In this process, the molten solder forms fillets around the ends of the leads projecting through the board to form connections between the leads of the discrete circuit elements and the printed circuit and also permanently retain the discrete elements in position on the board. The areas of the circuit board not meant for solder connection which might otherwise be coated thereby are protected by a coating which prevents the solder from adhering thereto.

It is often desirable to have connectors mounted on the same side of the circuit board as the other discrete circuit elements and connected into the printed circuit in the same wave soldering process. Such connectors are required in many cases to have openings adapted to receive a shaft member of the mating connector member; and such openings are necessarily narrow so that a tight fit is obtained for physical retention and good electrical conductivity. However, such narrow openings of conventional connector design usually encourage the wicking of molten solder by capillary action into the opening during the wave soldering process. When the solder hardens, the connector may be blocked with solder. This causes the need for protective procedures which add to the cost of the finished circuit board.

In addition, it is desirable for a connector for use on a circuit board to be simple in form, inexpensive to make and easy to assemble on the board, ideally being designed in such a way as to be easily placed on the board in assembly and to positively hold itself in correct position until the soldering process is complete. Tolerances should be non-critical for as many dimensions as possible. The part should be universally applicable to all sizes of board and connector and adapted to operate correctly as a connector after assembly in a failure-proof manner.

SUMMARY OF THE INVENTION

The invention is a printed circuit board with an integral connector and method for making it, the board comprising an insulating circuit board with a pair of mounting openings therethrough and an electrically conducting printed circuit on one side and a connector member on the other side comprising a strip of electrically conducting material having a pair of oppositely oriented concave legs joined in a convex head, each of the concave legs each having a width greater than the width of the mounting openings and an end abutting the circuit board from which end extends a foot of narrower width, the foot having a length slightly greater than the width of the circuit board, each foot being inserted through one of the mounting openings from the side opposite the printed circuit, the concave head being effective to bias the convex legs outward against the outer sides of the mounting openings, the mounting openings being spaced from each other a distance sufficient to maintain the concave legs in contact with each other at their point of closest approach but separated by a sufficient distance at the circuit board to prevent the wicking of liquid solder therebetween by capillary action. At least one of the convex head and the circuit board midway between the mounting openings is provided with an access opening adapted to allow a connecting shaft member to penetrate from a direction perpendicular to the circuit board between the concave legs of the connector member and be engaged thereby in physical and electrical connection. Solder connections on the side of the circuit path opposite the connector member join the feet projecting through the circuit board to the printed circuit on the circuit board and permanently retain the connector member on the circuit board, but are ineffective thereby to prevent engagement of the connector member by the conducting shaft member.

In its method of manufacture, the insulating circuit board is created with the two mounting openings and the electrically conducting path on one side. Separately, the connector member is created from a strip of flat conducting metal with the a pair of oppositely oriented concave legs joined in the convex head as described above, the concave legs being held slightly apart by the convex head when no forces are applied thereto so that the feet are spaced slightly wider apart than the mounting openings. An access opening for a connecting shaft member is provided through at least one of the convex head of the connector body or the circuit board midway between the mounting openings. In assembly, a pinching force is applied to the connector to bias the legs together for insertion into the mounting openings. Next, each of the feet is inserted through one of the mounting openings in the circuit board from the side opposite the electrically conducting path; and the pinching force is released to allow the feet to move outward from each other to engage the outer sides of the mounting openings. The resulting assembled apparatus holds itself together through the spring bias of the connector member against the sides of the mounting openings until the board is wave soldered on the side opposite the connector so as to connect the feet in the printed circuit on the circuit board. Since the legs of the connector body are separated by a significant distance at the circuit board, no solder is drawn by capillary action between the legs during the wave soldering process to foul the connector.

It will be seen from the preceding, as well as the accompanying drawings and detailed description of a preferred embodiment, that the invention meets all of the requirements set forth above. There are few dimensions of critical tolerance. The spacing of the mounting openings of the circuit board, which is easy to control, determines the insertion force of the connector and allows change thereof with no tooling changes for the connector member itself. The connector member is a simple, single piece which may be stamped and bent in conventional sheet metal forming processes. The connector is easy to assemble on the board by squeezing and inserting, after which it holds itself in place on the board until soldering and retains its spring after soldering to firmly grasp the mating connector member. The connector and board combination is easily adapted for connection from either side of the board by providing an access opening in the convex head of the connector member or in the board midway between the mounting openings. If desired, the combination may be made with both openings for universal application.

Further details and advantages of the invention will be apparent from the accompanying drawings and following description of a preferred embodiment.

DESCRIPTION OF THE PREFERRED EMBODIMENT

Figure 3:
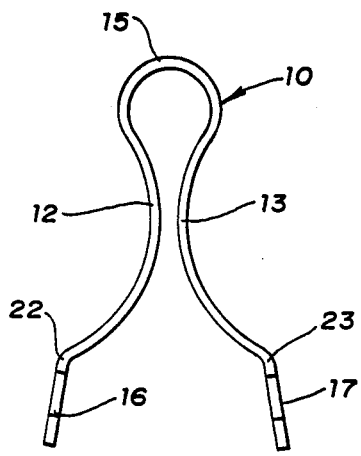
FIG. 3 is a side elevation view of the connector member before assembly on the circuit board.
Figure 4:
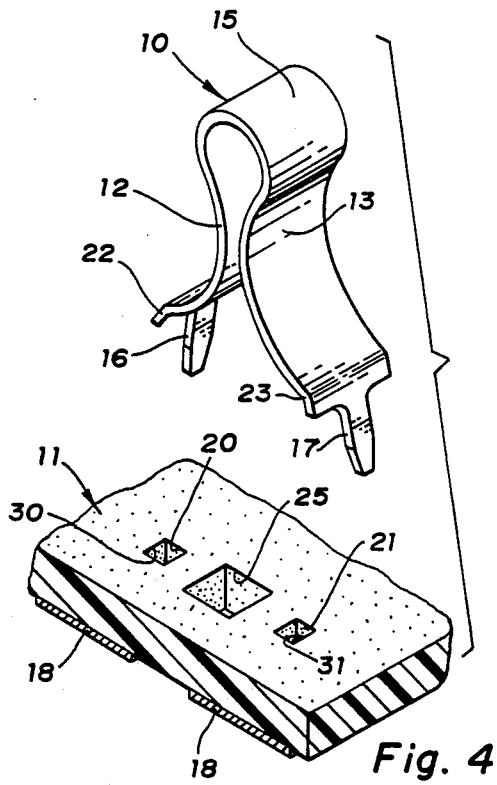
FIG. 4 is a perspective view illustrating the circuit board and connector member in position for assembly.

Referring first to FIGS. 3 and 4, the connector 10 and circuit board 11 are shown before assembly. Connector 10 is formed from a single piece of brass 0.376 to 0.386 mm thick and finished with a stannate tin plate coating at least 0.005 mm thick. It comprises a pair of oppositely oriented concave legs 12, 13 which are 4.0 mm wide and joined by a convex head 15 of the same width. Convex head 15 describes the arc of a circle with a center within connector 10 and a radius of 1.8 mm; and legs 12 and 13 describe arcs of circles with centers outside connector 10 and radii of 6.1 mm. The ends 22 and 23, respectively, of legs 12 and 13 opposite head 15 are spaced apart by about 8.8 mm when no forces are applied. Feet 16 and 17 project substantially straight from the ends of legs 12 and 13, respectively. Each of feet 16 and 17 is 1.1 mm wide and approximately 3.2 mm long and ends in a tapering portion with a taper of 20 degrees on each side. The total length from the junction of feet 16, 17 and legs 12, 13 to the top of head 15 is 12.7 mm. As shown in the Figures, the unbiased connector 10 has its legs 12 and 13 spaced apart at their closest point by about 1.0 mm.

Figure 1:
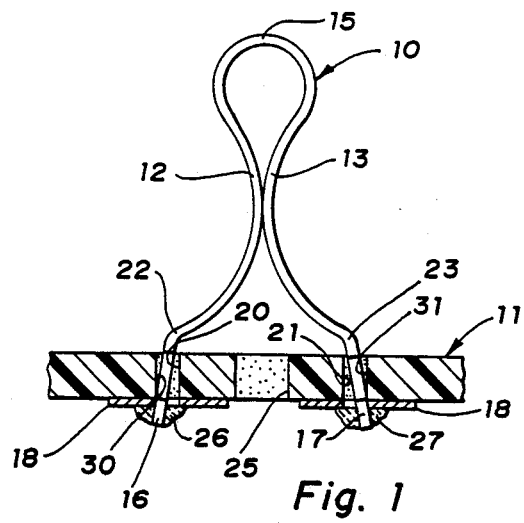
FIG. 1 is a side cutaway view of a circuit board with integral connector without the mating connector member.

Circuit board 11, a portion of which is shown in FIG. 4, is of standard construction, being made from an insulating material of the usual type and having a printed circuit 18 of a copper or similar conducting film on the bottom side thereof in the Figure. Those areas of circuit board 11 not covered by printed circuit 18 and not forming the walls of an opening for the lead of a discrete circuit element are coated with a substance preventing the adhesion of solder in a manner well known in the art. Mounting openings 20 and 21 extend through the board 11 bout 7.0 mm apart. Mounting openings 20 and 21 are sufficiently large in size to permit easy entry of feet 16 and 17 during assembly, but they are smaller than the 4.0 mm width of legs 12 and 13. Mounting openings 20 and 21 open on the printed circuit side of the board within printed circuit 18, as shown in FIG. 1. There is optionally provided an access opening 25 through circuit board 11 midway between mounting openings 20 and 21. Access opening 25 does not open within printed circuit 18. Access opening 25 provides access to connector 10 through board 11 for a mating male connector shaft inserted from the printed circuit side of the board and is not otherwise necessary. Its size depends on the size and fit of the mating connector member. It most probably would be larger than mounting openings 20 and 21 and is so shown.

FIG. 1 shows the assembled circuit board 10 with integral connector 10. Feet 16 and 17 project through mounting openings 20 and 21, respectively, with ends 22 and 23 of legs 12 and 13 abutting the side of circuit board 10 opposite printed circuit 18. Feet 16 and 17 are soldered with solder joints 26 and 27, respectively, to printed circuit 18. Since the soldering is accomplished in a wave soldering process in which the board is dipped into an ample supply of molten solder, sufficient solder adheres to feet 16 and 7 to join connector member physically to circuit board 11 while joining it electrically to printed circuit 18. Ends 22 and 23 of legs 12 and 13 are too far apart on board 11 to encourage the wicking of solder by capillary action up between legs 12 and 13. In addition, there is no significant wicking of solder into access opening 25, if present; and any solder therein falls out as the board is withdrawn from the molten solder, since it does not adhere to the board in this area. Therefore, there is no solder blocking access to connector 10 or interfering with its action.

It may also be seen in FIG. 1 that, when mounted on board 11, the concave legs of connector 10 are engaged at their point of closest approach. Since the ends 22 and 23 of legs 12 and 13 are, when unbiased, 8.8 mm apart, but mounting openings 20 and 21 are only 7.0 mm apart, connector 10 must be biased into the compressed configuration shown in FIG. 1 to be mounted on board 11. This produces a number of benefits. First, it provides for positive engagement of the connector and board during assembly without extra positioning members, since the spring action of connector 10 attempting to return to its unbiased shape causes feet 16 and 17 to positively engage and grip the respective outer surfaces 30 and 31, respectively, of mounting openings 20 and 21. In addition, in the assembled board and connector, the concave legs 12 and 13 are in contact for a firm grip of, and good electrical contact with, mating connector member 28 regardless of the precise distance separating these legs in the unbiased connector 10. In other words, the dimension most important for controlling the operation of connector 10 is transferred from connector 10 itself, wherein it might be difficult to control and would require tooling changes for change, to the spacing of the mounting openings 20, 21 in board 11, which is much easier to control and requires no tooling changes to connector 10 when it is changed.

Figure 2:
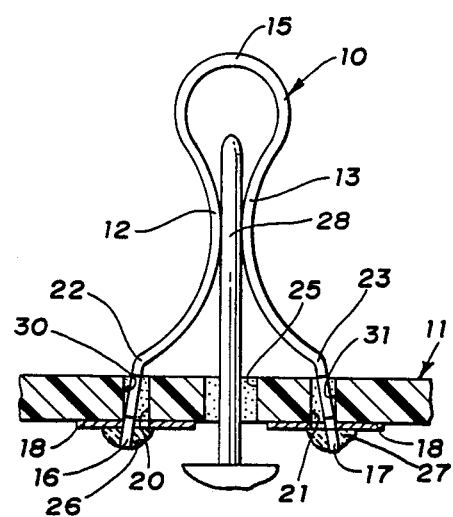
FIG. 2 is a side cutaway view of the circuit board and integral connector with a mating connector member inserted from the printed circuit side of the board.

FIG. 2 shows the embodiment of FIG. 1 with the mating connector member, shaft 28, engaged with connector 10. Shaft 28 is inserted through access opening 25 and forces apart the concave legs 12 and 13, which then grip shaft 28 for retention thereof and good electrical contact therewith. The gripping force is controlled by the spacing of concave legs 12, 13, which is controlled, as previously mentioned, by the spacing of mounting openings 20, 21 in board 11.

Figure 5:
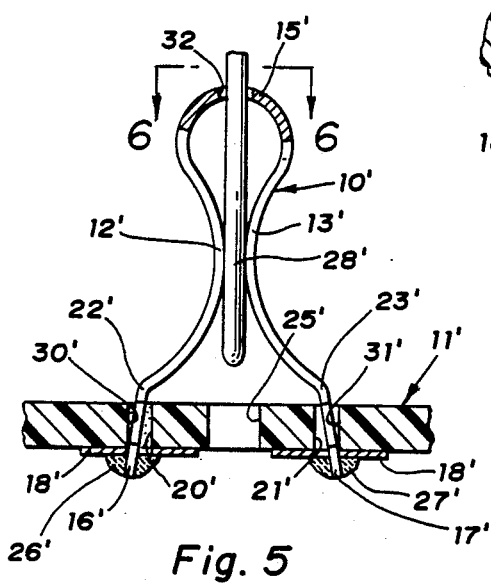
FIG. 5 is a side cutaway view of another embodiment of the circuit board and integral connector with a mating connector member inserted from the discrete element side of the board.
Figure 6:
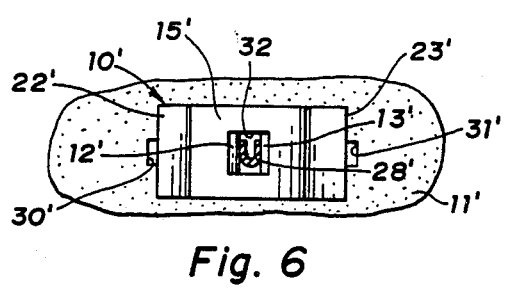
FIG. 6 is a section view along lines 6—6 in FIG. 5.

Another embodiment of the invention is shown if FIGS. 5 and 6. This embodiment is identical to that of FIGS. 1–4, with similar parts given similar primed reference numbers, except that the convex head 15' of connector 10' is provided with an access opening 32, through which shaft 28' of the mating connector member may be inserted from the connector side of board 11 rather than the printed circuit side. In this case, access opening 25' in board 11' is not necessary, although it may be included as shown for adaptability to the insertion of shaft 28' from either side of board 11'.

In the assembly of the combination of connector 10 and board 11, the connector and board are first separately prepared and aligned as shown in FIG. 4. Connector 10 is then pinched until concave legs 12 and 13 are in engagement and feet 16 and 17 are separated by the proper distance for insertion in mounting openings 20 and 21, respectively, of board 11. Connector 10 is then advanced toward board 11 with feet 16 and 17 proceeding through openings 20 and 21 until ends 22 and 23 of legs 12 and 13 abut board 11. The pinching force is then released; and legs 12 and 13 spring outward against surfaces 30 and 31 to hold connector 10 positively in place as previously described until soldering. Board 11 wave soldered by dipping the printed circuit side thereof into a pool of molten solder in a standard wave soldering process, whereupon the solder forms fillets around the leads of the discrete elements and the feet 16 and 17 for electrical connection thereof with printed circuit 18 and for permanent retention of the elements and connector 10 on board 11. No solder, however, is retained in access opening 25, if present; and no solder wicks up between concave legs 12 and 13.

The embodiments of the invention in which an exclusive property or privilege is claimed are defined as follows:

1. A printed circuit board assembly with a soldered integral connector adapted to receive a mating connector shaft with no solder blockage of the connector, the printed circuit board assembly comprising, in combination:

connector means comprising a single strip of electrically conducting metal having a pair of oppositely oriented concave legs joined at one end in a convex head providing a spring bias therefore with each concave leg having a narrow foot on its other end, the concave legs being spaced apart by a smaller distance at a closest point intermediate their one and other ends than at their other ends;

an insulating circuit board with a pair of mounting openings therethrough, a central access opening between the mounting openings and an electrically conducting printed circuit on one side thereof bordering at least one of the mounting openings, the mounting openings receiving the feet of the connector means inserted from the other side of the circuit board and being spaced apart by a distance (1) sufficiently small to force the concave legs toward each other against the bias of the convex head so that the feet are biased outward against walls of the mounting openings and so that the concave legs are adapted for physical and electrical at their closest point, with an engagement force precisely determined by the distance, of the mating connector shaft when inserted through the central access opening, and (2) sufficiently great to maintain the feet apart in the openings to prevent the wicking of liquid solder by capillary action from the mounting openings or access opening between the concave legs on a wave soldering process; and a solder connection in each of the mounting openings physically retaining the feet therein with at least one of the solder connections electrically connecting the connector means to the printed circuit, the solder connections not extending away from the circuit board between the concave legs and therefore not blocking access to the connector means by the mating connector shaft.

2. A printed circuit board assembly according to claim 5 in which an additional access opening is provided in the convex head of the connector for insertion of the mating connector shaft from the one side of the circuit board.

3. The printed circuit board assembly of claim 1 in which the concave legs are of a first width, the narrow feet are of a second width less than the first width and the mounting openings are each of a third width intermediate the first and second widths so that the connector means is located in a predetermined manner in a direction normally to the board by insertion of the narrow feet into the mounting openings.

4. A method of manufacturing a printed circuit board assembly with an integral connector housing wave soldering without blockage of the connector by solder wicked thereinto by capillary action comprising the following steps:

forming a strip of flat, electrically conducting metal into a connnector member having a pair of oppositely oriented concave legs joined at one end in a convex head providing a bias force resisting deformation and having narrow feet on the other ends of the concave legs, the concave legs being spaced apart by a smaller distance at a closest point intermediate their one and other ends than at their other ends;

providing a pair of mounting openings through an insulating circuit board having an electrically conducting printed circuit on one side thereof bordering at least one of the mounting openings, the mounting openings being spaced more closely than the feet of the connector member;

providing an access opening for a mating connecting shaft member through the circuit board midway between the mounting openings;

applying a pinching force to the connector to bias the legs together so that the feet are spaced for insertion in the mounting openings of the circuit board;

inserting each of the feet in one of the mounting openings in the circuit board from the side opposite the printed circuit and releasing the pinching force, whereby the feet are biased outward by the convex head against the walls of the mounting openings and the connector member retained on the circuit board in a predetermined position with the other ends of the concave legs being spaced sufficiently far apart to prevent the wicking of liquid solder between the concave legs by capillary action from the mounting openings or access opening during wave soldering; and wave soldering the side opposite the connector so as to connect the feet in the printed circuit on the circuit board and permanently retain the feet in the mounting openings, the mounting openings being spaced sufficiently apart to prevent the wicking of solder from the mounting openings or access opening between the concave legs by capillary action during the wave soldering process with the concave legs nevertheless spaced at their closest point so as to physically and electrically engage, with an engagement force determined by the spacing of the mounting openings, of a mating connector shaft inserted through the access opening.

* * * * *